United States Patent [19]

Hamel

[11] Patent Number: 4,865,241
[45] Date of Patent: Sep. 12, 1989

[54] METHOD AND APPARATUS FOR SUBDIVIDING INTO PIECES A CERAMIC PLATE

[75] Inventor: Christian Hamel, Menilles, France

[73] Assignee: U.S. Philips Corporation, New York, N.Y.

[21] Appl. No.: 679,190

[22] Filed: Dec. 7, 1984

Related U.S. Application Data

[63] Continuation of Ser. No. 444,413, Nov. 24, 1982, abandoned.

[30] Foreign Application Priority Data

Nov. 25, 1981 [FR] France .................... 81 22043

[51] Int. Cl.⁴ .............................................. B26F 3/00
[52] U.S. Cl. ........................................... 225/2; 225/4; 225/96.5; 225/97
[58] Field of Search ................... 225/2, 96.5, 97; 125/23 R

[56] References Cited

U.S. PATENT DOCUMENTS

| | | | |
|---|---|---|---|
| 3,396,452 | 8/1968 | Sato et al. | 225/2 X |
| 3,507,426 | 4/1970 | Bielen et al. | 225/2 |
| 3,743,148 | 7/1973 | Carlson | 225/2 |
| 3,786,973 | 1/1974 | Bussman et al. | 225/2 |
| 4,247,031 | 1/1981 | Pote et al. | 225/2 |

OTHER PUBLICATIONS

Western Electric Technical Digest No. 60, Substrate Snapping Apparatus, J. F. Pollitt, Oct. 1980.

Primary Examiner—Frank T. Yost
Assistant Examiner—Hien H. Phan
Attorney, Agent, or Firm—Paul R. Miller

[57] ABSTRACT

The invention provides a method and apparatus for breaking ceramic substrates which are used in the manufacture of hybrid electronic circuits. The substrate to be divided is subjected to a predetermined rigid deformation by means of two rigid dies having a circular cross-section with radii which differ. The centers of curvature of the circular cross-sections coincide when the dies are in their final position.

8 Claims, 2 Drawing Sheets

METHOD AND APPARATUS FOR SUBDIVIDING INTO PIECES A CERAMIC PLATE

This is a continuation of application Ser. No. 444,413, filed Nov. 24, 1982, now abandoned.

The invention relates to a method of subdividing into pieces a ceramic plate in which at least one line of fracture has been formed beforehand, according to which method this plate is placed against a first die which has a cylindrical convex surface facing the plate and a second die which has a cylindrical concave surface facing the plate, said first and second dies forming an assembly of dies, the generatrices of the first surface and of the second surface being substantially parallel to each other and parallel to the aforementioned line of fracture.

In the electronic industry, use is made of so-called hybrid circuits which are mounted on a ceramic plate. In order to reduce the cost, a plurality of circuits are manufactured on one large plate which has to be subdivided at a chosen instant of the manufacturing process to obtain individual circuits.

Of course, the plate can be sawn, but the method used in most cases consists in that a line of fracture is formed beforehand on the ceramic and in that then a mechanical force is exerted, which causes the fracture of the plate along this line of fracture.

In the prior art, more or less artisanal solutions have been proposed, such as the arrangement of the ceramic plate on an elastic base and the conduction of a roller over this plate in order to bring about the fracture along the lines of fracture. With this method, the force to be exerted is hardly reproducible and varies with the elasticity of the base, which results in a high rejection rate due to fracture outside the provided fracture lines. It has further been proposed to use a pair of tongs by means of which a bending force can be exerted on the plates, the lines of fracture having to be treated one by one.

Consequently, these methods are not satisfactory. However, there is a technique of a similar kind which can provide a solution for such methods, i.e. the semiconductor technique in which semiconductor wafers have to be subdivided. The material to be treated and the dimensions are different, but the object in view is similar and, with certain adaptations the same techniques can be used.

A method of breaking according to this technique is described in U.S. Pat. No. 3,743,148 entitled "Wafer Breaker". This Patent discloses a machine comprising a curved die against which is placed a semiconductor wafer held on a flexible support and a steel band which is stretched and which will adapt the shape of the curved die. This machine yields better results than those obtained according to the prior art in which an elastic base was used, but in the relevant case in which the dimension of the pieces to be obtained is not very small with respect to the starting plate, it has the disadvantage that it is difficult to control the tension exerted on the steel band if it should be avoided that after the desired subdivision each piece continues to break into smaller pieces. It is clear that, if a slightly excessive force is exerted on the steel band, the wafer is crushed in an uncontrolled manner.

The invention has for its object to provide a method which avoids this disadvantage. The invention is based on the idea to subject the plate to be subdivided not to a given force, but to a geometrically predetermined deformation. Thus, at the instant at which the desired fracture occurs, the exerted force is eliminated and further undesired cracks can no longer take place.

A method according to the invention is therefore characterized in that the two dies of this assembly of dies are moved towards each other until a predetermined distance between them is obtained.

As is indicated above, the advantage of this method is that any undesired cracks of the manufactured product are avoided.

A special embodiment of the method according to the invention in which at least a second line of fracture has been formed beforehand in the ceramic plate, which line encloses an angle with the first line, is characterized in that the ceramic plate is brought between the dies by means of an adhesive transport tape and in that in the path of the adhesive transport tape is arranged a second assembly of dies, the generatrices of the cylindrical surfaces of the dies of the second assembly being substantially parallel to the second line of fracture.

By proceeding in this manner it is not necessary to rotate the plate so that it can pass a second time between the dies, which requires a complex mechanization.

The invention is also dealing with an apparatus for performing the method comprising a first die which has a first cylindrical convex surface and a second die which has a cylindrical concave surface, the generatrices of which are substantially parallel to those of the convex surface, at least one of the dies being displaceable with respect to the other characterized by a stop limiting the relative stroke of the dies.

Such an apparatus does not give rise to undesired cracks of the manufactured product.

Advantageously, the dies are both made of a rigid material. Thus, a better geometric definition can be obtained of the deformation to which the plate to be subdivided is subjected.

In a special embodiment, the apparatus is chacterized in that the two dies have circular cross-sections with different radii and in that, when these dies engage their stop in the position in which they are closest to one another, the centers of the circular cross-sections substantially coincide.

The advantage of this embodiment is that it provides particularly simple, inexpensive means for obtaining the desired geometric conditions.

When such an apparatus comprises an adhesive transport tape, this is advantageously divided into several parallel bands each corresponding to a ceramic piece after the subdivision of the plate in a direction parallel to that of the transport tape.

Thus, the pieces can be more readily separated after they have been introduced into the apparatus.

In order that the invention may be readily carried out, it will now be described more fully with reference to the accompanying drawings, in which.

Figure 1:
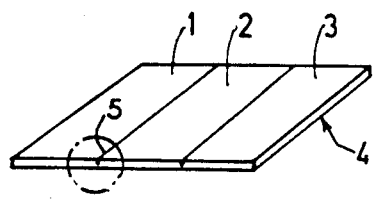
FIG. 1 is a perspective view of a ceramic plate in which a line of fracture has been formed.
Figure 1A:
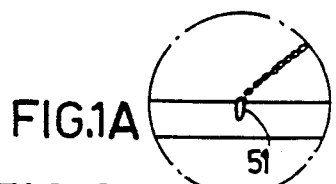
FIG. 1A shows a portion of FIG. 1.

FIG. 1 shows a ceramic plate 4, in which at least a first line of fracture 5 has been formed beforehand. In this embodiment, it is desired to form three pieces 1, 2, 3 from the plate 4. The line of fracture 5 is formed, for example, by means of a row of small recessed holes 51 formed with the aid of a laser, which row is represented on an enlarged scale in FIG. 1A.

Figure 2A:
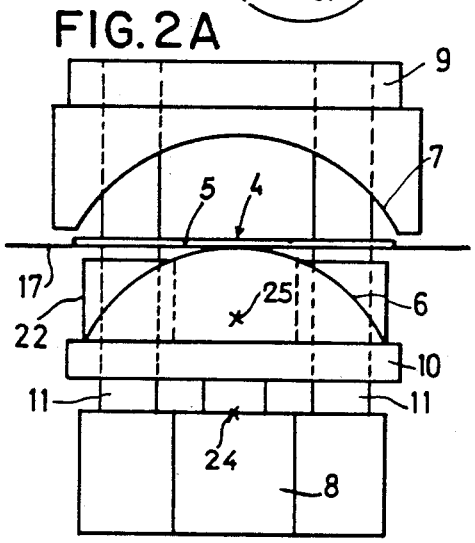
FIG. 2A shows a front elevation and FIG. 2B a side elevation of an apparatus according to the invention in a charging position.
Figure 2B:
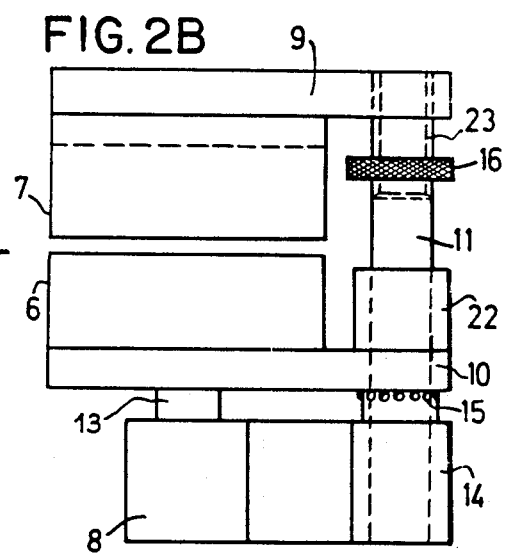
Figure 6:
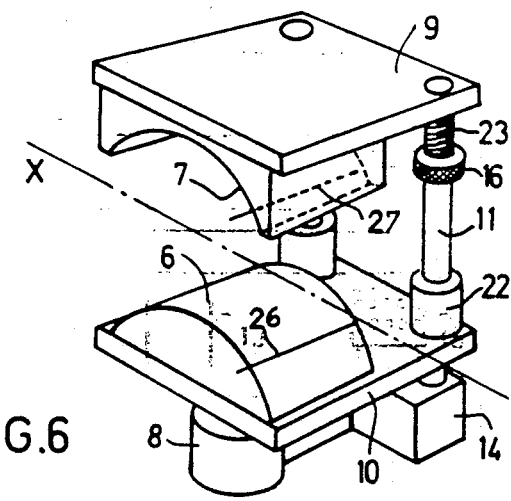
FIG. 6 shows the apparatus of FIG. 2A in perspective view.

In order to break the plate 4, this plate is placed, as shown in FIGS. 2A and 2B, against a first die 6 which has a cylindrical convex surface opposite the plate. On the other side of this plate 4 is placed a second die 7 which has cylindrical concave surface with respect to the plate, the generatrices of the first surface and of the second surface being substantially parallel to each other. In order to illustrate this disposition, a generatrix 26 of the surface 6 and a generatrix 27 of the surface 7 are shown in FIG. 6, which shows the same machine as FIGS. 2A and 2B, also in the charging position, in order to understand more clearly FIGS. 2A and 2B. Of course, in the two figures like parts are designated by the same references. These generatrices 26, 27, which are parallel to each other, are also parallel to the lines of fracture 5: all these lines are at right angles to the plane of FIG. 2A in the front elevation shown on the left hand side.

In a simple embodiment, these two dies have circular cross-sections with different radii. The centers of these circular cross-sections are represented at 24 and 25, respectively, for the dies 6 and 7.

The machine shown comprises a base provided with a hydraulic jack 8 and with supports 14 for columns 11. These columns support on the one hand a plate 9, under which the die 7 is fixed, and on the other hand sleeves 22 which slide over ball sleeves 15 and to which a plate 10 is fixed, which supports the die 6.

This plate 10 can be moved upwards or downwards by means of the piston 13 of the jack 8, the die 6 consequently being displaceable.

After the plate 4 has been placed against the die 6, the two dies of this first assembly of dies are moved towards each other until a predetermined distance is reached between them. This distance is obtained by limiting the relative stroke of the dies into their end position by means of a stop formed, for example, by an adjustable ring 16 against which the sleeves 22 abut, as a result of which the upward movement of the plate 10 and of the die 6 is stopped, the die 7 being fixed in this case.

Figure 3A:
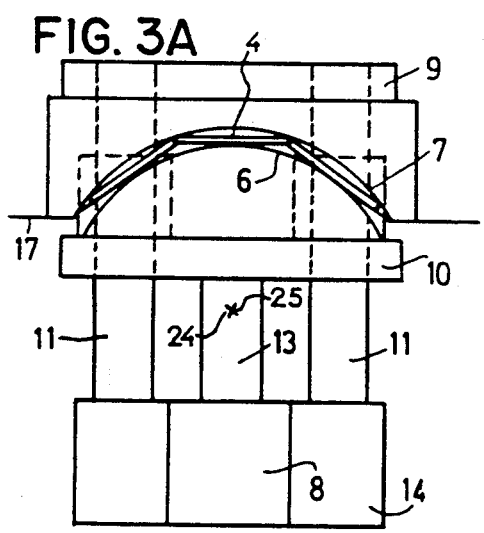
FIG. 3A and FIG. 3B show the same apparatus in the end position in which the dies engage their stop.
Figure 3B:
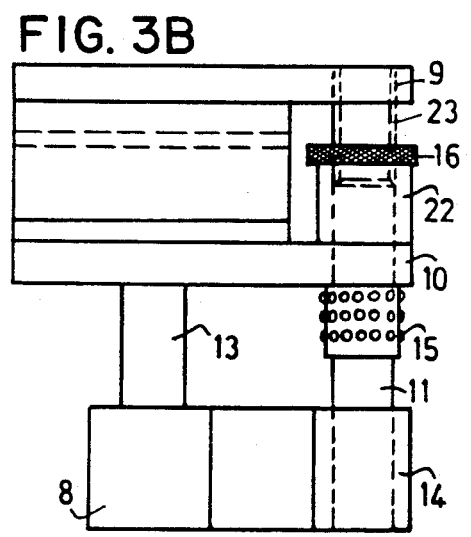

The machine is shown in FIG. 3 with its dies being placed against the stop in their end position in which they are as close to each other as possible. The centers 24, 25 of the semi-circular cross-sections of the dies then substantially coincide. Of course, a space is left between the dies in which the ceramic plate 4 is accommodated, which in this case is broken into three pieces, as is desired in this embodiment. In the end position shown, the ceramic plate once divided into three pieces is no longer subjected to any force, each piece being accommodated exactly in the space between the dies, as will be explained in greater detail below with reference to FIG. 5. The relevant space being defined with accuracy, there is no need to provide for an elasticity in the system and it has even been found that this is unfavourable. Consequently, the dies are advantageously manufactured both from a rigid material.

The stop ring 16 is adjustable due to a thread 23 on the column 11 which permits of accurately adjusting the height of the stop. In order to simplify the Figure, this ring is not shown in the front elevation. One ring on one of the columns 11 may be considered sufficient or a ring may be arranged on both columns in order to obtain a better definition of the end position of the die 6.

Figure 4:
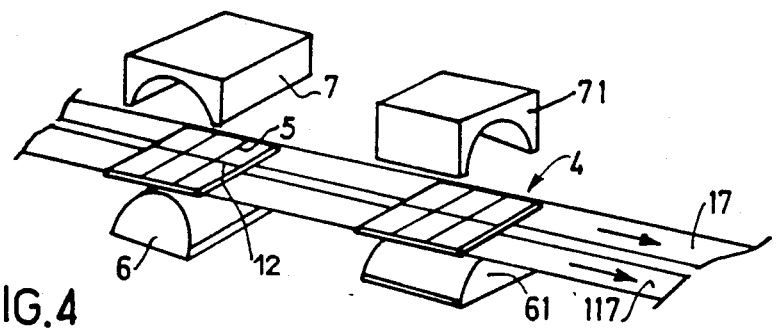
FIG. 4 shows diagrammatically a special example of the method according to the invention.

In FIGS. 2, 3 and 4, there is also shown an an adhesive transport tape 17 which serves to bring the ceramic plates 4 between the dies 6, 7 and to remove them after their fracture. This tape is advantageously provided with an adhesive on the face opposed to that carrying the fracture lines 5 and is facing the convex die with, the fracture lines 5 facing the concave die.

As is shown in FIG. 4 it is usual to form beforehand in the ceramic plate at least a second line of fracture 12 besides the first line 5, which lines enclose an angle, generally a straight angle.

It is then advantageous to place in the path of the adhesive transport tape a second assembly of dies 61, 71, the generatrices of the cylindrical surfaces of the second assembly 61, 71 being substantially parallel to the second line of fracture 12. According to the prior art, it was usual to rotate the plate 4 and to press it a second time against the convex die. This method not only requires a complicated mechanical construction, but is also hardly compatible with the transport of the plates by means of an adhesive tape. Moreover, in the case of the invention, the form of the dies depends upon the dimensions of the pieces to be obtained, which dimensions are generally different for each direction of the lines 5 or 12, so that it is more advantageous to use a second assembly of dies, this solution remaining economical due to the low cost of the device according to the invention.

The adhesive transport tape 17 is advantageously divided into several parallel bands 17, 117 each corresponding to a ceramic piece after the subdivision of the plate in a direction parallel to that of the transport tape. In the embodiment shown in FIG. 4, the first assembly of dies 6, 7 breaks the plate along the lines 5, thus forming three pieces which adhere to both the two adhesive bands 17 and 117. In the second assembly of dies 61, 71, the pieces are further subdivided in the direction of the line 12 parallel to that of the transport tape and each band corresponds to one of the pieces formed by the fracture along the line 12.

In order to simplify FIG. 4, only the dies are shown. The latter are each supported by a device of the type with reference to FIGS. 2, 3 and 6. In FIG. 6, a line X represents the orientation of the transport tape, which is the same orientation with respect to the columns 11 in the two assemblies 6, 7 and 61, 71, only the orientation of the dies being changed. A device not shown but known per se charges the plates 4 on the band 17, 117 upstream with respect to the device shown. By adjusting this device so that it places the plates with a relative distance which is an integral submultiple of the distance between the two assemblies of dies 6, 7 and 61, 71, these two assemblies can be made operative at the same time.

As far as the choice of the radius of curvature of the dies is concerned, there is a certain freedom, but on the other hand there is an accurate relation between the radii of the two dies of an assembly.

For the determination of the radius of curvature of one of the dies, for example the die 7, the following conditions have to be considered. A minimum value is imposed by the condition that the plate 4 can enter entirely the interior of the die 7; this is possible only if the diameter of its cross-section exceeds the dimension of the plate.

As far as the maximum value of the radius is concerned, this value is obtained by the condition that the inflection imposed on the plate must exceed that which is allowed by the elastic limit of the ceramic material of the plate provided with its lines of fracture, otherwise it could be possible that the plate would not break. This value, which depends upon the plates and upon the manner in which the lines of fracture are formed, can be very readily measured empirically.

Figure 5:
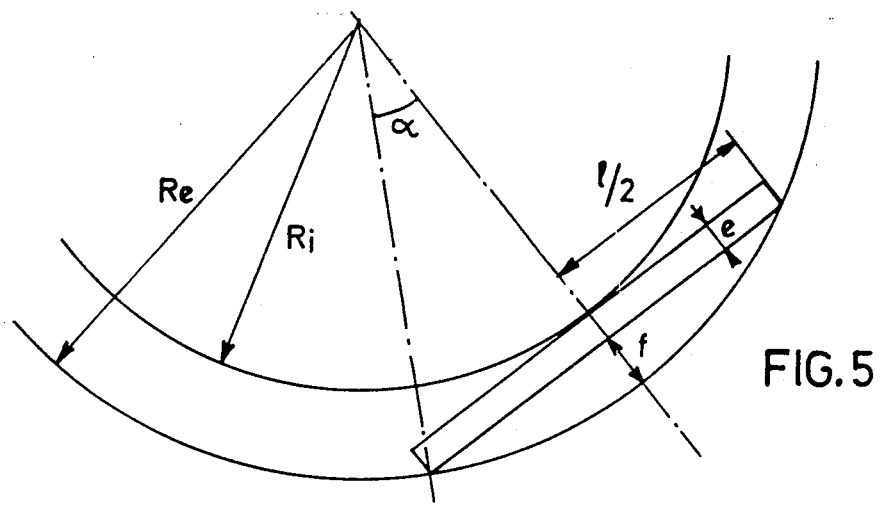
FIG. 5 is a geometric figure for explaining the calculation of the radii of curvature of the dies.

Consequently, between the indicated minimum and maximum values of the radius there is a fairly large range of values that can be chosen. On the contrary, when one of the radii has once been chosen, the other is calculated in the following manner as a function of the dimension of the pieces that should be obtained. In FIG. 5 the cross-sections of the two dies are represented in their relatively closest possible position by two circles having a radius $R_i$ and $R_e$ respectively. The piece to be obtained has a thickness e and a length l; it is accurately inscribed between the two circles. The transport tape can be taken into account by incorporating its thickness in the value chosen for e. Let it be assumed that the angle $\alpha$ is such that:

$$(l/R_e) = \sin \alpha.$$

The rise f is equal to: $f = R_e (1 - \cos \alpha)$ and $R_i = R_e - f - e$. When $R_e$ has once been chosen, an accurately determined value of $R_i$ is thus calculated and the difference $R_e - R_i$ is the predetermined distance between the dies when they are placed against the stop in the position in which they are as close to each other as possible. Consequently, a unique model of the die 7 may be available but, as to the die 6, a specific radius of curvature $R_i$ is required for each dimension of a desired piece. However, there exists a positive and a negative tolerance. If in the final position of the dies the pieces are subjected to a small force because the distance between the dies is too small, this is not disadvantageous as long as the aforementioned inflection corresponding to the elastic limit of the pieces is not exceeded (but in this case the elastic limit without a line of fracture is concerned). If on the contrary in the final position the pieces are located with clearance between the dies, this no longer of importance provided that the fracture has occured beforehand. Consequently it has been found that there is no need of a separate die 6 for each dimension of the piece, but that with one die a range of dimensions can be covered. In order to satisfy all the dimensions, there is consequently only need of a limited number of dies 6.

However, it should be noted that in the case in which the pieces are located with clearance between the dies, this clearance must be very strongly limited due to a special problem. Generally, the dimension of the pieces is not an integral submultiple of the dimension of the plate so that a remainder is formed which is smaller than the desired pieces. If the pieces are arranged with clearance, it is possible that a piece with the remainder formed thereon will be accommodated without exertion of force between the dies, if this remainder is small; in this situation the remainder is not separated. As a consequence, a further condition will now be mentioned with respect to the choice of the maximum radius $R_e$. It is necessary that a piece with a remainder formed thereon, which is placed between the dies which are in a position against the stop as close to each other as possible, has a curvature sufficient to exceed the elastic limit. For a given dimension of a piece, the curvature due to the excess size of the piece with the remainder formed thereon is a maximum for a minimum value of the radius $R_e$. A maximum value of the radius, at which the remainder is separated can be obtained most simply by experiments. It has further been found that a remainder, the dimension of which is smaller than a given dimension, cannot be correctly removed, irrespective of the method utilized. A radius $R_e$ of the order of the length of the plates 4 before fracture is a correct mean starting value which can be improved by experiments.

It should be appreciated that all that is explained above with respect to the dies 6 and 7 is perfectly reversible. The concave die can replace the convex die, and conversely, one of the two dies or both dies at the same time can be displaceable; the die, of which only one specimen is required, can be the convex die and the concave dies can be adapted to the dimensions of the pieces.

Of course, also other embodiments than those described above can be utilized. The dies may be supported by articulated rods instead of being sliding; the hydraulic jack may be replaced by any other pressing means, for example, by a hand lever. In a strongly mechanized embodiment the two assemblies of dies shown in FIG. 4 may be associated with the laser by means of which the lines of fracture are formed, in order to constitute a complete and independent breaking apparatus.

What is claimed is:

1. A method of subdividing a ceramic plate into pieces comprising the steps of forming at least one first line of fracture on said ceramic plate, placing said ceramic plate between at least one assembly of a first die of rigid material and of a second die of rigid material, said first die having a cylindrical convex surface facing one surface of said ceramic plate, and said second die having a cylindrical concave surface facing a second opposite surface of said ceramic plate, wherein said convex surface has generatrices substantially parallel to generatrices of said concave surface, said generatrices being parallel to said first lines of fracture, and wherein said convex surface and said concave surface have different radii of curvature, and moving said first and second dies toward each other to a stop position to form a predetermined distance between said dies, said stop position being set so that said ceramic plate fractures along said first lines of fracture.

2. A method according to claim 1, further comprising the steps of forming at least one second line of fracture in said ceramic plate at the time of forming said first lines of fracture, said first and second lines of fracture being at an angle with each other, placing another assembly of two dies adjacent said at least one assembly, said two dies of said another assembly having generatrices substantially parallel to said second lines of fracture forming said ceramic plate on an adhesive transport tape, and moving said adhesive transport tape from said at least one assembly to said another assembly, wherein said ceramic plate is subdivided along said first lines of fracture in said at least one assembly and subdivided along said second lines of fracture in said another assembly.

3. An apparatus for subdividing a ceramic plate into pieces comprising
a first die having a circular cross-sectional cylindrical shape, said shape being a convex surface with a first radius of curvature,
a second die having a circular cross-sectional cylindrical shape, said shape being a concave surface with a second different radius of curvature Re, said concave surface havingg generatrices substantially parallel to generatrices of said convex surface,
means for moving said first and second dies toward each other, and
stop means for limiting displacement of said first and second dies toward each other at a predetermined separation, said separation being substantially equal to $$e + Re[1 - \cos(\arcsin(1/2Re))]$$

where e is a thickness of the ceramic plate and 1 is a dimension at right angles to lines of fracture,
wherein said ceramic plate having at least one line of fracture is placed between said first and second dies, and said ceramic plate fractures along said lines of fracture at said separation, and
wherein centers of said circular cross-sectional shapes substantially coincide.

4. An apparatus according to claim 3, wherein a second assembly of two dies is provided, said two dies having generatrices at an angle to said generatrices of said first and second dies, and wherein said ceramic plate is mounted on an adhesive transport tape to move said ceramic plate between said dies.

5. An apparatus according to claim 4, wherein said adhesive transport tape is divided into several parallel bands, each of said parallel bands corresponding to pieces of said ceramic plate after subdivision in a direction parallel to the direction of said adhesive transport tape.

6. An apparatus for subdividing a ceramic plate into pieces comprising
at least one assembly of a first die of rigid material having a cylindrical convex surface and of a second die of rigid material having a cylindrical concave surface, said convex surface having generatrices substantially parallel to generatrices of said concave surface, said convex and concave surfaces having different radii of curvature,
means for moving said first and second dies toward each other, and
stop means for limiting displacement of said first and second dies toward each other at a predetermined separation,
wherein a ceramic plate having at least one line of fracture is placed between said first and second dies, and said ceramic plate fractures along said lines of fracture at a stop position determined by said stop means.

7. An apparatus according to claim 6, wherein another assembly is provided of two dies having generatrices at an angle to said generatrices of said first and second dies, and wherein said ceramic plate is mounted on an adhesive transport tape to move said ceramic plate between said assemblies of dies.

8. An apparatus according to claim 7, wherein said adhesive transport tape is divided into several parallel bands, each of said parallel bands corresponding to pieces of said ceramic plate after subdivision in a direction parallel to the direction of said adhesive transport tape.

* * * * *